(12) United States Patent
Mohan et al.

(10) Patent No.: US 11,402,413 B1
(45) Date of Patent: Aug. 2, 2022

(54) DROOP DETECTION AND MITIGATION

(71) Applicant: Marvell Asia Pte, Ltd., Singapore (SG)

(72) Inventors: Nitin Mohan, Northborough, MA (US); Thucydides Xanthopoulos, Watertown, MA (US)

(73) Assignee: Marvell Asia Pte, Ltd., Singapore (SG)

( * ) Notice: Subject to any disclaimer, the term of this patent is extended or adjusted under 35 U.S.C. 154(b) by 356 days.

(21) Appl. No.: 16/704,483

(22) Filed: Dec. 5, 2019

Related U.S. Application Data

(60) Provisional application No. 62/778,375, filed on Dec. 12, 2018.

(51) Int. Cl.
| | | |
|---|---|---|
| *G01R 19/165* | (2006.01) | |
| *G01R 31/30* | (2006.01) | |
| *G06F 1/26* | (2006.01) | |
| *H03K 19/003* | (2006.01) | |

(52) U.S. Cl.
CPC ... *G01R 19/16504* (2013.01); *G01R 31/3004* (2013.01); *G06F 1/26* (2013.01); *H03K 19/00346* (2013.01)

(58) Field of Classification Search
CPC . G01R 19/16504; G01R 31/3004; G06F 1/26; H03K 19/00346
USPC .................................................. 324/762.02
See application file for complete search history.

(56) References Cited

U.S. PATENT DOCUMENTS

| | | |
|---|---|---|
| 6,285,230 B1 | 9/2001 | Na |
| 6,600,345 B1 | 7/2003 | Boutaud |
| 6,686,785 B2 | 2/2004 | Liu et al. |
| 7,145,831 B2 | 12/2006 | Goller |

(Continued)

OTHER PUBLICATIONS

Senger, et al., "Low-Latency, HDL-Synthesizable Dynamic Clock Frequency Controller with Self-Referenced Hybrid Clocking," IEEE, ISCAS 2006.

(Continued)

*Primary Examiner* — Farhana A Hoque
(74) *Attorney, Agent, or Firm* — Hamilton, Brook, Smith & Reynolds, P.C.

(57) ABSTRACT

In an embodiment, a method includes filtering, with a low-pass filter, a voltage signal ($V_{dd}$) of a chip to create a filtered signal ($V_{ref}$). The method further includes dividing $V_{ref}$ by a given factor. The method further includes determining whether a voltage droop occurred in $V_{dd}$ by comparing $V_{dd}$ to the divided $V_{ref}$. The method further includes outputting a droop detection signal if $V_{dd}$ is less than the divided $V_{ref}$. In an embodiment, dividing $V_{ref}$ by the given factor includes selecting, with a multiplexer, one of a plurality of divided $V_{ref}$ signals outputted by a voltage divider. The selecting is based on a selection signal.

19 Claims, 6 Drawing Sheets

(56) References Cited

U.S. PATENT DOCUMENTS

| | | |
|---|---|---|
| 7,551,909 B1 | 6/2009 | Moon et al. |
| 7,764,095 B2 | 7/2010 | Werner et al. |
| 7,952,404 B2 | 5/2011 | Petrie |
| 7,971,088 B2 | 6/2011 | Jung |
| 9,425,779 B2 | 8/2016 | Jung |
| 9,654,121 B1 | 5/2017 | Chu |
| 10,162,373 B1* | 12/2018 | Chong .................. H03K 5/24 |
| 10,530,370 B1 | 1/2020 | Mohan et al. |
| 10,784,871 B1 | 9/2020 | Xanthopoulos et al. |
| 10,784,874 B1 | 9/2020 | Xanthopoulos |
| 2002/0079937 A1 | 6/2002 | Xanthopoulos |
| 2002/0097592 A1 | 7/2002 | Komurasaki |
| 2004/0017234 A1* | 1/2004 | Tam ..................... G06F 1/324 327/141 |
| 2007/0170967 A1 | 7/2007 | Bae |
| 2007/0194815 A1 | 8/2007 | Nelson |
| 2012/0068748 A1 | 3/2012 | Stojanovic et al. |
| 2013/0238309 A1 | 9/2013 | Ting et al. |
| 2014/0195081 A1 | 7/2014 | Kwak et al. |
| 2014/0327478 A1 | 11/2014 | Horng et al. |
| 2014/0347107 A1 | 11/2014 | Kim |
| 2015/0162921 A1 | 6/2015 | Chen et al. |
| 2015/0213873 A1 | 7/2015 | Joo |
| 2015/0277393 A1 | 10/2015 | Liu et al. |
| 2015/0326231 A1 | 11/2015 | Thinakaran |
| 2016/0013796 A1 | 1/2016 | Choi |
| 2016/0077572 A1 | 3/2016 | Chang |
| 2016/0351269 A1* | 12/2016 | Okuno ..................... G11C 7/02 |
| 2018/0351770 A1 | 12/2018 | Chiu |
| 2019/0007055 A1 | 1/2019 | Nelson |
| 2020/0044657 A1 | 2/2020 | Pi et al. |
| 2020/0076439 A1 | 3/2020 | Weeks et al. |
| 2020/0076440 A1 | 3/2020 | Ng et al. |
| 2020/0083891 A1 | 3/2020 | Huh et al. |

OTHER PUBLICATIONS

Sidiropoulos, et al., "A Semidigital Dual Delay-Locked Loop," IEEE Journal of Solid-State Circuits, vol. 32, No. 11, Nov. 1997.

Zoni, et al., "A DVFS Cycle Accurate Simulation Framework with Asynchronous NoC Design for Power-Performance Optimizations," J. Sign. Process Syst., published online Mar. 24, 2015.

U.S. Appl. No. 16/709,367, entitled "Traversing A Variable Delay Line In A Deterministic Number Of Clock Cycles," filed Dec. 10, 2019 Mohan et al.

U.S. Appl. No. 16/528,311, entitled "DLL-Based Clocking Architecture with Programmable Delay at Phase Detector Inputs", filed Jul. 31, 2019.

* cited by examiner

DROOP DETECTION AND MITIGATION

RELATED APPLICATION

This application claims the benefit of U.S. Provisional Application No. 62/778,375, filed on Dec. 12, 2018.

The entire teachings of the above application(s) are incorporated herein by reference.

BACKGROUND

A chip or processor is manufactured on a die as part of a package and part of a mold. The chip has long traces of wire that have inductance. Chips are becoming more high-performance or power-efficient (low power). High performance chips can use varying and high amounts of current. Power-efficient chips often turn unused components off and on, resulting in varying levels of current throughout the chip at different times.

SUMMARY

In an embodiment, a method includes filtering, with a low-pass filter, a voltage signal ($V_{dd}$) of a chip to produce a filtered signal ($V_{ref}$). The method further includes dividing $V_{ref}$ by a given factor. The method further includes compares $V_{dd}$ to the divided $V_{ref}$. The method further includes outputting a droop detection signal if $V_{dd}$ is less than the divided $V_{ref}$.

In an embodiment, dividing $V_{ref}$ by the given factor includes selecting, with a multiplexer, one of a plurality of divided $V_{ref}$ signals outputted by a voltage divider. The selecting is based on a selection signal.

In an embodiment, outputting the droop detection signal includes setting at least one SR Latch, wherein the SR Latch stores the droop detection signal. The at least one SR Latch may include a local SR Latch and a global SR Latch. The local SR Latch is cleared by a finite state machine local to the local SR latch. The global SR Latch is cleared by a finite state machine global to the chip.

The method can further include, upon receiving the droop detection signal, decreasing a frequency of the chip from a full frequency to a lower frequency. The method may also include increasing the frequency of the chip to at least one intermediate frequency. The intermediate frequency is between the full frequency and the lower frequency.

In an embodiment, comparing $V_{dd}$ to $V_{ref}$ uses a sense amplifier.

In an embodiment, the method includes storing, in a database, the droop detection signal.

In an embodiment, a droop detection circuit includes a low-pass filter configured to filter a voltage signal ($V_{dd}$) of a chip to produce a filtered signal ($V_{ref}$). The system further includes a voltage divider configured to divide $V_{ref}$ by a given factor. The system further includes a sense amplifier configured to compare $V_{dd}$ to the divided $V_{ref}$ and configured to output a droop detection signal if $V_{dd}$ is less than the divided $V_{ref}$.

In an embodiment, the droop detection circuit further includes a multiplexer configured to select one of a plurality of divided $V_{ref}$ signals outputted by the voltage divider. The selecting can be based on a selection signal.

In an embodiment, the droop detection circuit includes at least one SR Latch. The SR Latch stores the droop detection signal. The at least one SR Latch can include a local SR Latch and a global SR Latch. The local SR Latch is cleared by a finite state machine local to the local SR latch. The global SR Latch is cleared by a finite state machine global to the chip.

In an embodiment, the droop detection circuit further includes a clock division module configured to, upon receiving a droop detection signal, decrease a frequency of the chip from a full frequency to a lower frequency. The clock division module can be further configured to increase the frequency of the chip to at least one intermediate frequency. The intermediate frequency is between the full frequency and the lower frequency.

In an embodiment, the droop detection circuit further includes an interface to a database that is configured to store, in the database, the droop detection signal.

In an embodiment, a processor includes a root clock, a droop detection circuit coupled with to the root clock, and a droop mitigation circuit. The droop detection circuit is configured to detect a voltage droop in a source voltage. The droop mitigation circuit is configured to, in response to detecting the voltage droop, reduce a frequency of the root clock of the processor.

In an embodiment, the processor further includes at least one local droop detection circuit being located on a die of the processor and configured to detect local voltage droops.

In an embodiment, the droop detection circuit includes a low-pass filter configured to filter a voltage signal ($V_{dd}$) of a chip to create a filtered signal ($V_{ref}$). The droop detector also includes a voltage divider configured to divide $V_{ref}$ by a given factor. The droop detector also includes a sense amplifier configured to compare $V_{dd}$ to the divided $V_{ref}$ configured to output a droop detection signal if $V_{dd}$ is less than the divided $V_{ref}$.

The droop detection circuit further includes a multiplexer configured to select one of a plurality of divided $V_{ref}$ signals outputted by the voltage divider, the selecting being based on a selection signal.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Figure 2:
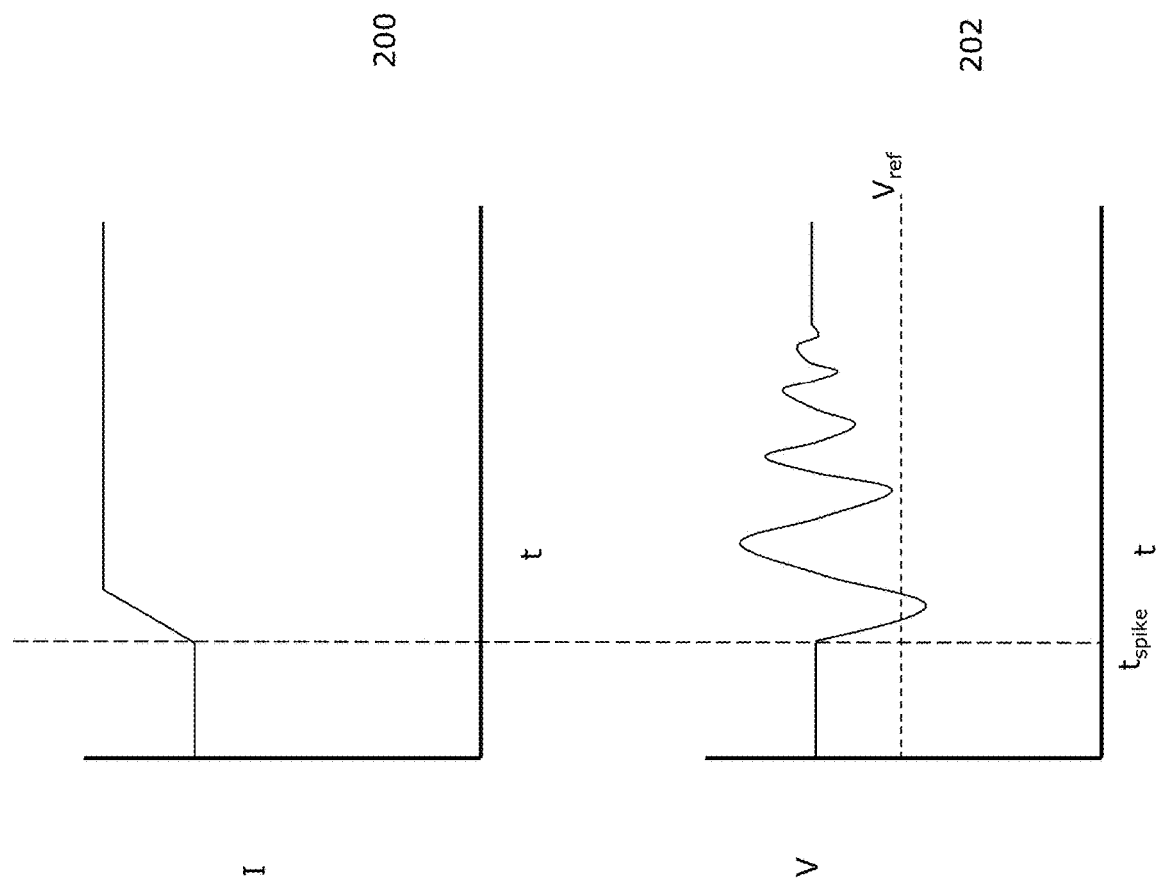
FIG. 2 are graphs illustrating example embodiments of current and voltage in a chip over time.

In modern high-performance and low-power chips, a sudden change in current consumption can result in a large voltage droop (L*dt) causing the chip to malfunction. FIG. 2 illustrates an example of such a voltage droop. This problem is exacerbated by more aggressive power management techniques (e.g., clock gating, power gating, and Dynamic Voltage Frequency Scaling (e.g., DVFS)) that can lead to sudden increases in current. For example, in mobile devices, many components are turned off to save power, which causes a current jump/spike. To solve this problem, an embodiment of the present disclosure is a droop detection and mitigation scheme.

Currently, droop voltages are mitigated by running chips at a lower frequency than the chip is capable. For example, consider a chip that runs at 1.2 Gigahertz (GHz). In addition, the maximum tolerable droop for this chip is 0.8 Volts (V), 0.2 V lower than the normal 1V. The chip may be sold to run at under 1.2 GHz so that the voltage drops may not reach 0.2V or higher. In other words, designers may engineer chips to sacrifice performance to have margin for error for when droops occur.

However, if the droop can be detected and managed in real-time, the chip can run at a higher frequency, or in a mode to save battery life or energy. A droop can be detected when voltage, which is usually a fixed level, begins decreasing.

The droop detection circuit can be placed at multiple places on a chip to manage droop mitigation. As soon as a droop happens anywhere on the chip, a droop mitigation module/circuit runs the chip at lower frequency. For a chip running at 1 GHz, for example, when a droop is detected, the root clock of that chip is running at the normal 1 GHz frequency. The frequency of the clock can be lowered immediately after droop detection. For example, the clock can be slowed by factors of ½, ⅔, or ⅚ (e.g., ⅜, ⅘, ⅝).

The droop detection circuit is placed close to the root so that droop mitigation can occur quickly. If the on-die power grid has low impedance, the entire die can detect the droop, however, droop detector closest to the root can mitigate the droop first. Every edge of every clock is sampled (both up and down edges). The output is buffered, but sampling every edge of every clock allows for a faster response to any voltage droop detection.

In an embodiment of the present disclosure, a circuit for detecting voltage droops includes an amplifier that is connected to a reference voltage ($V_{ref}$). $V_{ref}$ is a configured voltage that is lower than the standard source voltage. If the voltage of the source ($V_{dd}$) is less than $V_{ref}$, the circuit generates a droop detection signal. Due to sensitivity issues, a low pass filter including a resistor and capacitor clean the $V_{dd}$ signal of noise. A resistance ladder coupled with a multiplexer generates a $V_{Ref}$ signal for the multiplexer to select based on a configured selection signal.

Figure 1A:
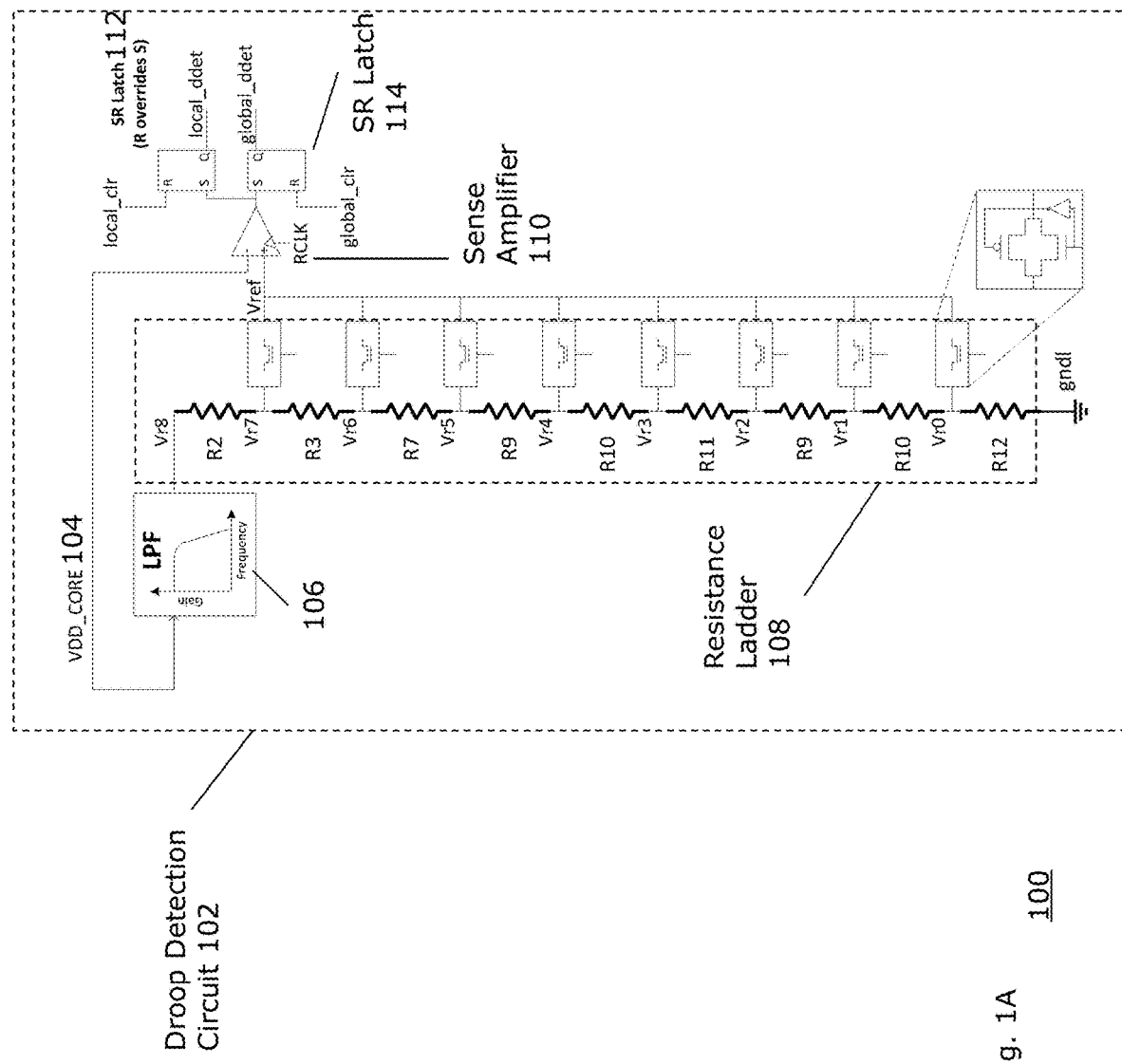
FIGS. 1A-B are circuit diagrams and illustrating example embodiments of a droop detector.
Figure 1B:
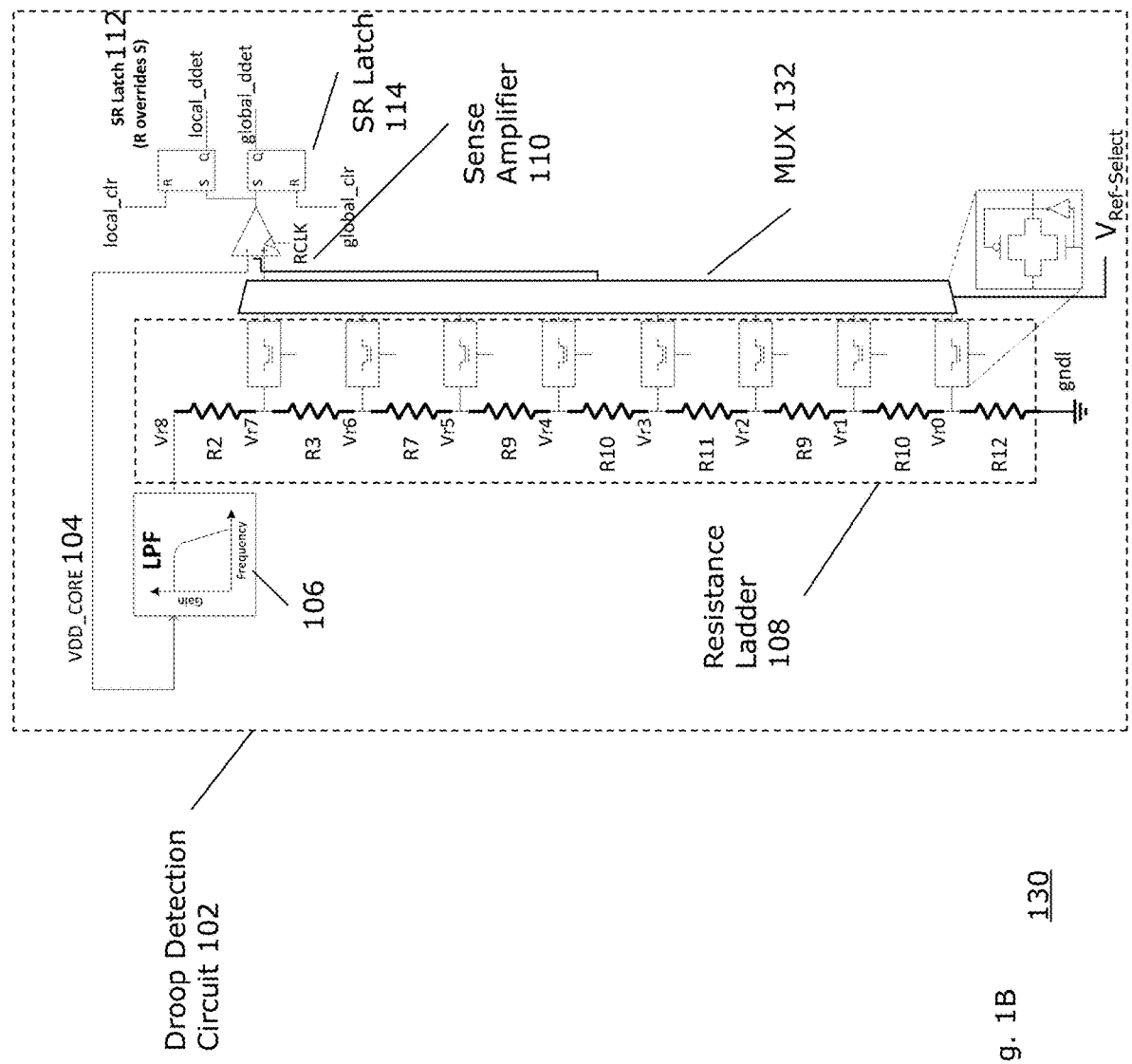

FIGS. 1A-B are circuit diagrams 100 and 130 illustrating example embodiments of a droop detector. The circuit includes a low-pass filter to generate a clean (e.g., noise-free) power-supply ($V_{ref}$), which is compared against the main (e.g., noisy) power-supply using a sense-amplifier. A combination of voltage divider and multiplexer (shown in FIG. 1B) provide the option to experimentally determine the optimum value of $V_{ref}$, where $V_{ref}$ is low enough not to unnecessarily trigger the droop detector for small power-supply noise but high enough to detect a fatal or dangerous droop event. $V_{ref}$ can be selected by a designer to optimize the droop detector as described above. $V_{ref}$ can be selected, for example, by a $V_{Ref-Select}$ input to the multiplexer 132 of FIG. 1B.

A sense amplifier 110 is sampled at both clock edges using a high-speed clock (RCLK) such that the droop mitigating circuit responds as soon as a droop event is detected. The sense amplifier 110 compares the selected $V_{ref}$ to the noisy source signal $V_{DD\_CORE}$. If the $V_{DD\_CORE}$ signal is lower than the $V_{ref}$ signal, the sense amplifier 110 outputs a signal that a droop is detected.

SR latches 112 and 114 store the droop-detector output (e.g., output of the sense amplifier 110). Once the SR latches 112 and 114 receive a signal of a droop detection, the respective latches 112 and 114 retain the signal until they receive a clear signal. The SR Latch 112 outputs a local droop detection signal (local_ddet) and are cleared by a local clear signal (local_clr). The SR Latch 114 outputs a global droop detection signal (global_ddet) and is cleared by a global_clr. The respective clear signals (local_clr and global_clr) represent completion of a droop mitigation mechanism. The droop mitigation mechanism is explained in more detail in relation to FIG. 3. In relation to FIGS. 1A-1B, a person having ordinary skill in the art can recognize that an additional shadow SR latch (not shown) can also locally save the droop detector response for debug purposes.

FIG. 2 are graphs 200 and 202 illustrating example embodiments of current and voltage in a chip over time. In graph 200, current increases at time $t_{spike}$ on a chip or for a component of a chip. For example, power saving may be disabled, or an additional component is enabled. Graph 202 shows that in response to the current spike, voltage initially droops after time $t_{spike}$. While the voltage eventually stabilizes, a mechanism to prevent damage to the chip when the voltage drops below a predetermined amount (e.g., $V_{ref}$) can be useful.

Figure 4:
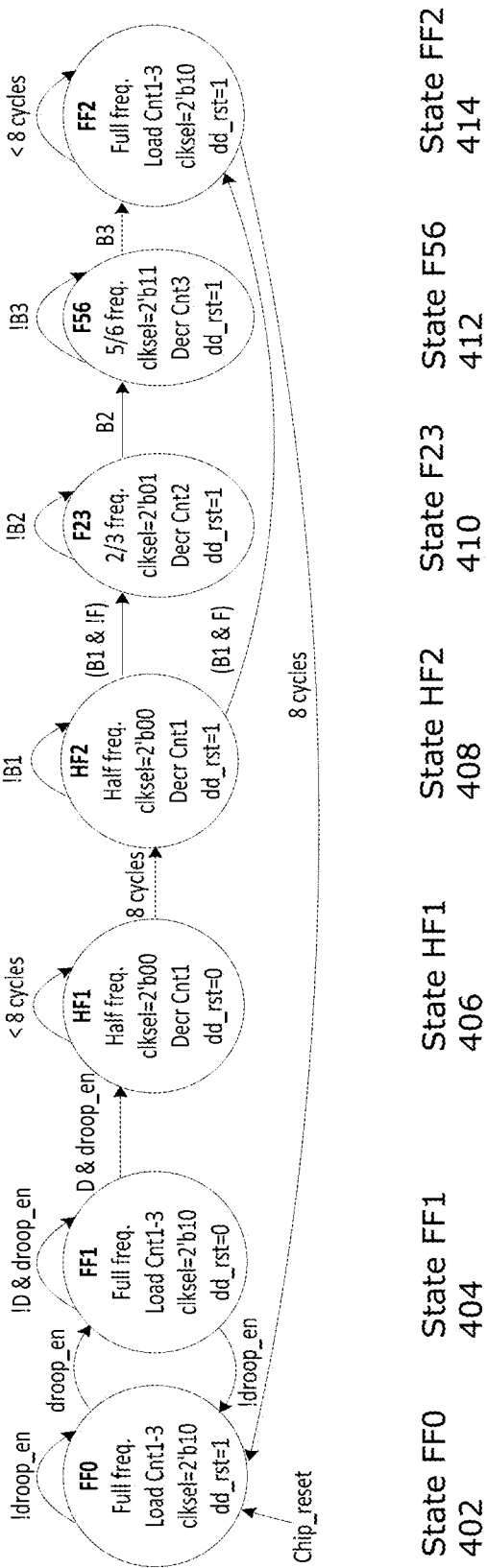
FIG. 4 is a state diagram illustrating an example embodiment of a state diagram used for droop mitigation by the finite state machine.

FIG. 4 is a diagram 400 illustrating the FSM to control droop detection and mitigation mechanisms. At chip reset, system clock runs at full-frequency (f). Once a master enable (droop_en) is asserted, droop detection/mitigation circuits are armed. When a droop event triggers the mitigation circuit, the circuit switches the system clock to a lower frequency (e.g. f/2) for a programmable number of cycles. The droop detector output is latched so the FSM does not get multiple triggers for the same droop event and become unstable. Next, the system clock frequency is gradually increased in incremental (e.g. 1/6th) steps so another droop event is not triggered by a sudden increase in frequency. As the system clock returns to full-frequency again, FSM sends a clear signal to all droop detectors and rearms them for responding to the next droop event.

The global detection signal is a droop detector output that is cleared/re-armed by the global FSM. The global detection signal can be disabled by setting dsel to 0, and enabled by setting dsel to 1.

The droop_en signal is a CSR-controlled master enable signal input to the FSM. For example, droop mitigation can be disabled by setting droop_en to 0, and enabled by setting droop_en to 1. Even when disabled, droop detection can be monitored by DROs by using the local_ddet outputs.

The circuit can further include various counters that are CSR controlled decrementing counters. The counters can include a 6-bit counter, Cnt1, having a maximum of 64 reference clock cycles in a half frequency (HF) state (f/2). The counters can also include two 4-bit counters, Cnt2 and Cnt3, with maximum of 16 reference cycles in f2/3 state and f5/6 state.

By default, the values for the circuit shown in FIG. 2 are as follows:
 a) DRO FSM local_clr counter=312
 b) Cnt1=4
 c) Cnt2, Cnt3=4
 d) Droop_en=0
 e) Vref_sel*[3:0]=14
 f) Dsel*=0
 g) Ddet_csr=0

Figure 3:
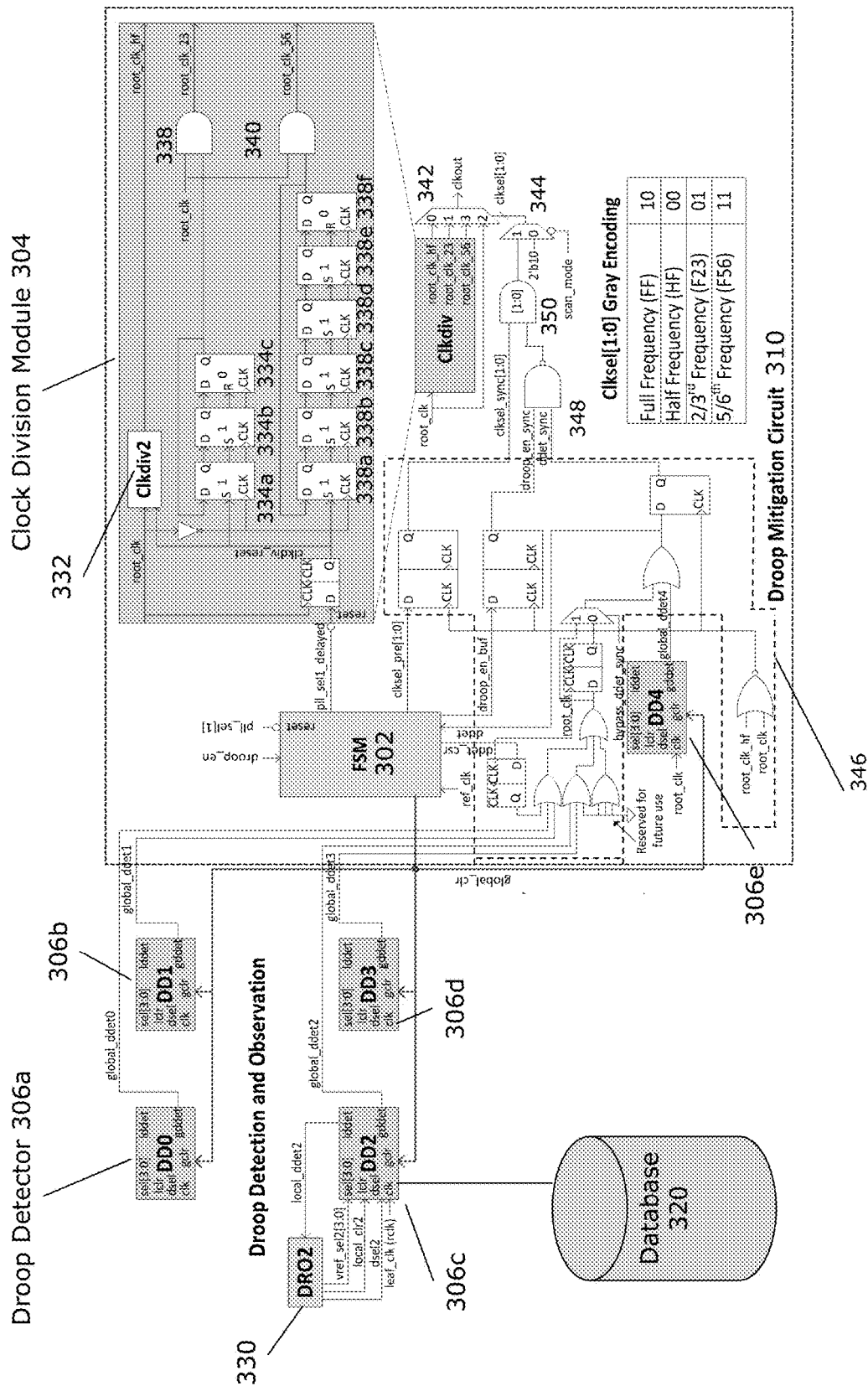
FIG. 3 is a diagram illustrating a chip scheme including droop detection circuits, a finite state machine, and a mitigation circuit.

FIG. 3 is a diagram 300 illustrating a chip scheme including droop detection circuits 306a-e, a finite state machine 302, and a mitigation circuit 310. When a droop event is detected by one of the droop detectors (e.g., DD0-4 306a-e), the mitigation circuit 310 reduces the clock frequency f (e.g., to f/2) to prevent further droop and damage to the chip. After recovering from the droop event in a programmable number of cycles, clock frequency can be increased in incremental steps (e.g., from f/2, 2f/3, 5f/6, to f).

The droop detector circuits 306a-e (DD0-4) are placed in various parts of the chip where the occurrence of a droop event is more likely. One droop detector, DD4 306e, is placed near the clock root (PLL), which allows quick response by the droop mitigation circuit 310 for a common-mode droop event, which is experienced across the whole chip. However, local droop detector circuits 306a-d, (DD0-3), are placed at other places on the chip that may experience local droop voltages.

Each droop detector circuit 306a-e is coupled with a control status register providing configuration values. For example, each droop detector 306a-e receives a voltage selection signal (e.g., vref_sel), a local clear signal (local_clr) and a global detection enablement signal (dsel). DRO2 is an example of a control status register 330 shown coupled to DD2 306c in FIG. 3. However, a person having ordinary skill in the art can recognize that other droop detectors 306a-e are coupled to respective control status registers that are not shown in the figure.

The local_ddet signal (lddet) is an output from each respective droop detector 306a-e that is cleared/re-armed by the local clear signal (local_clr) which is provided by the respective DRO (e.g., DRO2 330). The local clear (local_clr) signal is generated by a local finite state machine (FSM) (not shown) in each respective DRO module, which loads a 10-bit down-counter with a control status register (CSR) (e.g., DRO2 330 or other DRO) controlled value. The count-down is triggered by a rising edge of the local_ddet signal. Once the counter reaches zero, it asserts local_clr for a cycle, which clears the local_ddet of the respective droop detector, and re-loads the counter. The local_ddet signal also increments a CSR controllable and observable 16-bit counter (e.g., event monitor) in the DRO (e.g., DRO2 330 or other DRO).

Further, a database 320 can be coupled to one or more droop detection circuit 306c (or 306a-b, 306d-e, connection not shown). The droop detection circuit 306a-e can output its detection signal (e.g., gddet or lddet) to the database 320 for monitoring and analysis. In embodiments, a setting (not shown) can enable a monitor-only mode, where the droop mitigation circuit 310 is disabled but the droop detection circuit(s) 306a-e output droop detection signals (e.g., gddet or lddet) to the database 320 for later tracking and analysis.

As described above, when a droop event is detected by one of the droop detectors (e.g., DD0-4 306a-e), a clock division module 304 of the mitigation circuit 310 reduces the clock frequency f (e.g., to f/2) to prevent further droop and damage to the chip. After recovering from the droop event in a programmable number of cycles, the clock division module 304 can increase the clock frequency in incremental steps (e.g., from f/2, 2f/3, 5f/6, to f).

The clock division module 304 is configured to, upon receiving a droop detection signal (gddet, lddet), decrease a frequency of the chip from a full frequency to a lower frequency. The clock division module 304 can be further configured to increase the frequency of the chip to at least one intermediate frequency. The intermediate frequency is between the full frequency and the lower frequency.

The clock division module 304 receives the root clock signal (root_clk) and outputs three different clocks: f/2 (root_clk_hf), 2f/3 (root_clk_23), and 5f/6 (root_clk_56). The clock division module 304 generates the f/2 (root_clk_hf) signal based on the root clock and a reset signal delayed two cycles using a 50% clock divider 332.

The clock division module 304 further generates the f2/3 (root_clk_23) signal based on a reset signal delayed two cycles and three SR flip flops 334a-c in series. The output of the three flip flops 334a-c is input to an AND gate 338 with the root clock as the other input. A person having ordinary skill in the art can recognize that the SR flip flops are set to the values as illustrated in FIG. 3, such that flip flop 334a is reset to "1," 334b is reset to "1," and 334c is reset to "0." A person having ordinary skill in the art will further recognize that the flip flops 334a-c are configured to loop their starting values. Therefore, the combination of the rotating value of the last flip flop results in the output of the AND gate 338 being a clock at a $\frac{2}{3}^{rd}$ rate relative to the root clock.

The clock division module 304 further generates the f5/6 (root_clk_23) signal based on a reset signal delayed two cycles and six SR flip flops 336a-f in series. The output of the six flip flops 336a-f is input to an AND gate 340 with the root clock as the other input. A person having ordinary skill in the art can recognize that the SR flip flops 336a-f are set to the values as illustrated in FIG. 3, such that flip flop 336a-e are is reset to "1," and 336f is reset to "0." A person having ordinary skill in the art will further recognize that the flip flops 336a-f are configured to loop their starting values. Therefore, the combination of the rotating value of the last flip flop results in the output of the AND gate 340 being a clock at a $\frac{5}{6}^{rd}$ rate relative to the root clock.

The clock division module 304 outputs its respective clock signals to a multiplexer 342. The multiplexer 342 is a 4×1 multiplexer. The multiplexer 342 receives the root clock signal (root_clk) as well as the three divided clocks from the clock division module 304 (e.g., root_clk_hlf, root_clk_23, and root_clk_56. A second multiplexer, 344, selects an encoding, clksel[1:0], that selects the clock to output from the first multiplexer 342. The second multiplexer 344 selects based on a scan_mode input.

A plurality of circuit logic 346 (e.g., logic gates, latches, flip flops, etc.) is configured to receive droop detection signals from each respective droop detector 306a-e, as well as from the finite state machine 302. The finite state machine is described in further detail below in relation to FIG. 4. The circuit logic 346 outputs a clocksel_sync[1:0] signal, droop_en_sync signal, and ddet_snyc signal that are based on the respective input signals described above, but synchronize the respective signals. An AND gate 348 receives the droop_en_sync signal, and ddet_snyc, outputting a "1" when droop detection is enabled and a droop is detected, and a "0" when one or more of the input signals is also "0." A NAND gate 350 receives the output of AND gate 348 and clksel[1:0], and outputs the clksel[1:0] to the multiplexer 342 as a selection input only when the output of the AND gate 348 is "0." Therefore, the circuit logic 346 and gates 348 and 350 process input signals to determine whether the clock is divided, and if so to what level (f1/2, f2/3, f5/6).

FIG. 4 is a state diagram 400 illustrating an example embodiment of a state diagram used for droop mitigation by the FSM. Upon the chip start up or reset, the chip begins in state FF0 402. In state FF0, the chip runs at full frequency. The chip loads Cnt1, Cnt2, and Cnt3, sets a clock select (clksel) to 2'b10, and dd_rst to 1. If droop_en is false, the chip remains in state FF0 402. When droop_en is true, the chip moves to state FF1 404, where the chip continues to run at full frequency and dd_rst is set to 0. If droop_en becomes false, the chip returns to state FF1 402.

From state FF1 404, if a droop (D) is detected, the chip moves to state HF1 406. In state HF1 406, the chip runs at half frequency (f/2). The clock select (clksel) is set to 2'b00. Cnt1 is decreased by 1 each clock cycle. The FSM stays in HF1 406 for 8 cycles.

After 8 cycles, the FSM enters state HF2 408. In state HF2 408, dd_rst is set back to 1. Cnt1 continues to decrease until it reaches zero. When it reaches zero, B1 is satisfied and the FSM leaves HF2 408. If a fuse setting is enabled to jump directly to full frequency, the FSM transitions to state FF2 414. Otherwise, the FSM transitions to state F23 410. A person having ordinary skill in the art can recognize that the HF1 remains in its state for 8 cycles to make sure that the clock select signal has safely transitioned from 2'b10 to 2'b00 before the dd_rst signal is reasserted in state HF2 408.

In state F23 410, the processor runs at 2/3 frequency, with the clock select (clksel) set to 2'b01. In F23, Cnt2 is decreased each cycle. Upon Cnt2 reaching zero (B2 being satisfied), the FSM enters state F56 412.

In state F56 412, the processor runs at 5/6 frequency, with the clock select (clksel) set to 2'b11. The FSM decreases Cnt3 each cycle. Upon Cnt3 reaching zero and B3 being satisfied, the FSM moves to state FF2 414.

In state FF2 414, the processor runs at full frequency. The FSM loads Cnt1-2, and sets the clksel to 2'b10. It remains in this state for 8 cycles, and moves to state FF0 402 afterwards.

Figure 5:
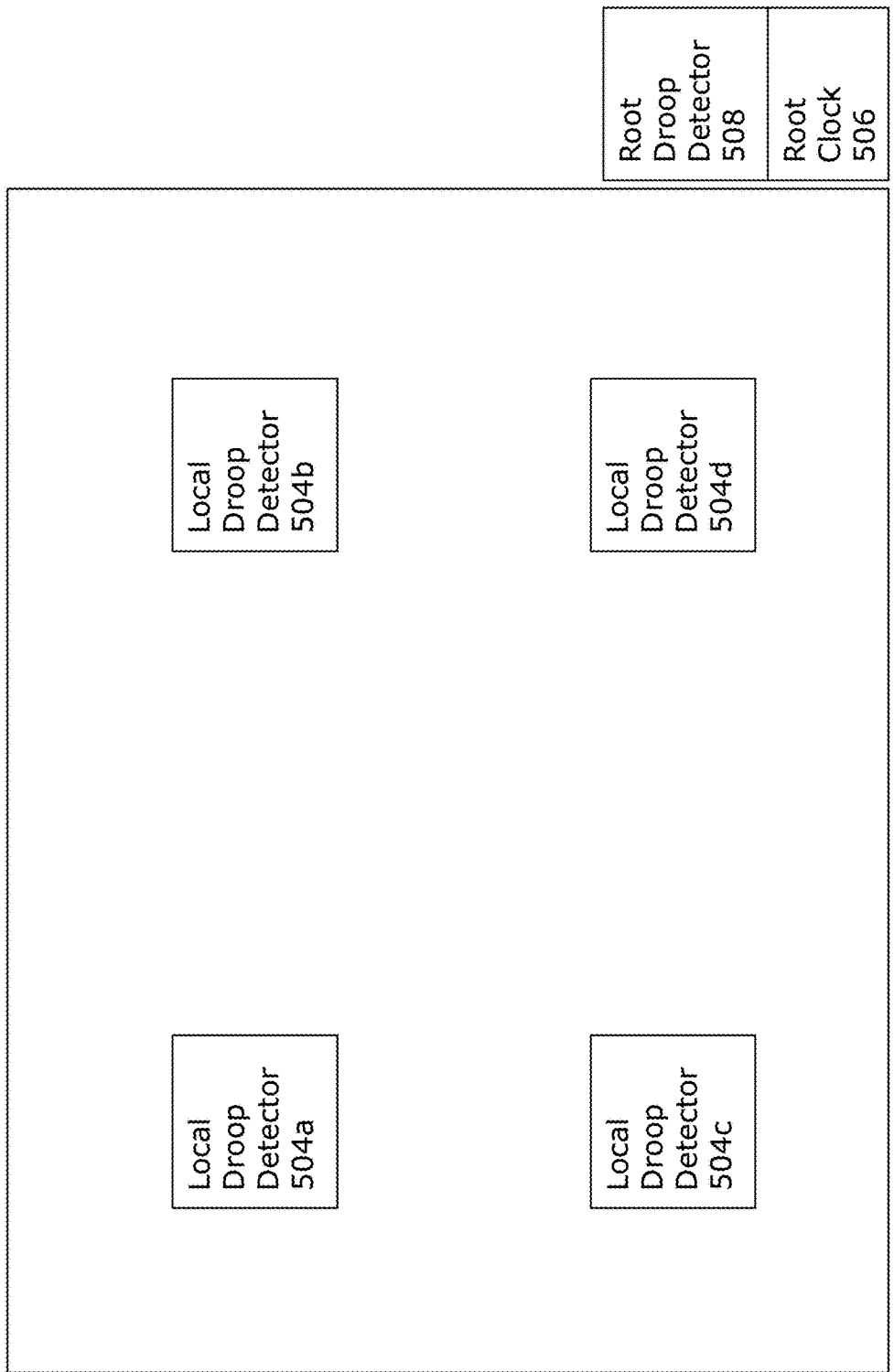
FIG. 5 is a high-level diagram illustrating an example embodiment of a chip employing an embodiment of the present disclosure.

FIG. 5 is a high-level diagram 500 illustrating an example embodiment of a chip 502 employing an embodiment of the present disclosure. The chip 502 includes a plurality of local droop detectors 504a-d distributed in different locations on the die. These droop detectors can detect local droops, for example. A person having ordinary skill in the art can recognize that any number of local droop detectors can be employed, however. In addition, the chip's root clock 506 is coupled to a dedicated root clock droop detector 508, which can detect droops in the root clock as soon as possible.

While example embodiments have been particularly shown and described, it will be understood by those skilled in the art that various changes in form and details may be made therein without departing from the scope of the embodiments encompassed by the appended claims.

What is claimed is:

1. A method comprising:
   filtering, with a low-pass filter, a first voltage signal ($V_{dd-1}$) of a root clock of a chip and a second voltage signal ($V_{dd-2}$) of a local clock of the chip to produce a first filtered signal ($V_{ref-1}$) of the root clock and a second filtered signal ($V_{ref-2}$) of the local clock;
   dividing $V_{ref-1}$ and $V_{ref-2}$ by a given factor;
   comparing $V_{dd-1}$ to the divided $V_{ref-1}$ and $V_{dd-2}$ to the divided $V_{ref-2}$; and
   outputting a droop detection signal if $V_{dd-1}$ is less than the divided $V_{ref-1}$ or if $V_{dd-2}$ is less than the divided $V_{ref-2}$.

2. The method of claim 1, wherein dividing $V_{ref-1}$ and $V_{ref-2}$ by the given factor includes selecting, with a multiplexer, one of a plurality of divided $V_{ref-1}$ and $V_{ref-2}$ signals outputted by a voltage divider, the selecting based on a selection signal.

3. The method of claim 1, wherein outputting the droop detection signal includes setting at least one SR Latch, wherein the SR Latch stores the droop detection signal.

4. The method of claim 3, wherein the at least one SR Latch includes a local SR Latch and a global SR Latch, wherein the local SR Latch is cleared by a finite state machine local to the local SR latch and the global SR Latch is cleared by a finite state machine global to the chip.

5. The method of claim 1, further comprising:
   upon receiving the droop detection signal, decreasing a frequency of the chip from a full frequency to a lower frequency.

6. The method of claim 5, further comprising:
   increasing the frequency of the chip to at least one intermediate frequency, the intermediate frequency being between the full frequency and the lower frequency.

7. The method of claim 1, wherein comparing $V_{dd-1}$ to the divided $V_{ref-1}$ and $V_{dd-2}$ to the divided $V_{ref-2}$ uses a sense amplifier.

8. The method of claim 1, further comprising:
   storing, in a database, the droop detection signal.

9. A droop detection circuit comprising:
   a low-pass filter configured to filter a first voltage signal ($V_{dd-1}$) of a root clock of a chip and a second voltage signal ($V_{dd-2}$) of a local clock of the chip to produce a first filtered signal ($V_{ref-1}$) of the root clock and a second filtered signal ($V_{ref-2}$) of the local clock;
   a voltage divider configured to divide $V_{ref-1}$ and $V_{ref-2}$ by a given factor;
   a sense amplifier configured to compare $V_{dd-1}$ to the divided $V_{ref-1}$ and $V_{dd-2}$ to the divided $V_{ref-2}$ and configured to output a droop detection signal if $V_{dd-1}$ is less than the divided $V_{ref-1}$ or if $V_{dd-2}$ is less than the divided $V_{ref-2}$.

10. The droop detection circuit of claim 9, further comprising:
    a multiplexer configured to select one of a plurality of divided $V_{ref-1}$ and $V_{ref-2}$ signals outputted by the voltage divider, the selecting being based on a selection signal.

11. The droop detection circuit of claim 9, further comprising at least one SR Latch, wherein the SR Latch stores the droop detection signal.

12. The droop detection circuit of claim 11, wherein the at least one SR Latch includes a local SR Latch and a global SR Latch, wherein the local SR Latch is cleared by a finite state machine local to the local SR latch and the global SR Latch is cleared by a finite state machine global to the chip.

13. The droop detection circuit of claim 9, further comprising:
    a clock division module configured to, upon receiving the droop detection signal, decrease a frequency of the chip from a full frequency to a lower frequency.

14. The system of claim 13, wherein the clock division module is further configured to:
    increase the frequency of the chip to at least one intermediate frequency, the intermediate frequency being between the full frequency and the lower frequency.

15. The system of claim 9, further comprising:
    an interface to a database that is configured to store, in a database, the droop detection signal.

16. A processor comprising:
    a root clock;
    at least one local clock;
    a first droop detection circuit located coupled to the root clock configured to detect a global voltage droop in a source voltage;

a second droop detection circuit located coupled to the local clock configured to detect a local voltage droop in the source voltage;

a droop mitigation circuit configured to, in response to the first or second droop detection circuit detecting the voltage droop at the root clock or local clock, respectively, reduce a frequency of the root clock of the processor.

17. The processor of claim 16, further comprising:
at least one local droop detection circuit being located on a die of the processor.

18. The processor of claim 16, wherein the first and second droop detection circuits each further include:
a low-pass filter configured to filter a voltage signal ($V_{dd}$) of a chip to create a filtered signal ($V_{ref}$);
a voltage divider configured to divide $V_{ref}$ by a given factor;
a sense amplifier configured to compare $V_{dd}$ to the divided $V_{ref}$ and configured to output a droop detection signal if $V_{dd}$ is less than the divided $V_{ref}$.

19. The processor of claim 18, wherein the droop detection circuit further includes:
a multiplexer configured to select one of a plurality of divided $V_{ref}$ signals outputted by the voltage divider, the selecting based on a selection signal.

\* \* \* \* \*

UNITED STATES PATENT AND TRADEMARK OFFICE
CERTIFICATE OF CORRECTION

PATENT NO. : 11,402,413 B1
APPLICATION NO. : 16/704483
DATED : August 2, 2022
INVENTOR(S) : Nitin Mohan and Thucydides Xanthopoulos Page 1 of 1

It is certified that error appears in the above-identified patent and that said Letters Patent is hereby corrected as shown below:

In the Specification

In Column 1, Line 27, delete "compares" and insert -- comparing --, therefor.

In Column 2, Line 65, delete "(L*dt)" and insert -- $(L * \frac{di}{dt})$ --, therefor.

In Column 6, Line 40, delete "root_clk_56." and insert -- root_clk_56). --, therefor.

In Column 6, Line 50, delete "snyc" and insert -- sync --, therefor.

In Column 6, Line 53, delete "snyc," and insert -- sync, --, therefor.

In Column 7, Line 4, delete "FF1 402." and insert -- FF1 404. --, therefor.

In the Claims

In Column 8, Line 54, in Claim 14, delete "system of claim 13," and insert -- droop detection circuit of claim 13, --, therefor.

In Column 8, Line 59, in Claim 15, delete "system of claim 9," and insert -- droop detection circuit of claim 9, --, therefor.

Signed and Sealed this
Twenty-fourth Day of January, 2023

Katherine Kelly Vidal
*Director of the United States Patent and Trademark Office*